(12) United States Patent
Feng (10) Patent No.: US 12,309,950 B2
(45) Date of Patent: *May 20, 2025

(54) HINGE, DISPLAY PANEL, AND ELECTRONIC DEVICE

(71) Applicant: WUHAN CHINA STAR OPTOELECTRONICS SEMICONDUCTOR DISPLAY TECHNOLOGY CO., LTD., Hubei (CN)

(72) Inventor: Zikang Feng, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/757,565

(22) Filed: Jun. 28, 2024

(65) Prior Publication Data

US 2024/0349434 A1 Oct. 17, 2024

Related U.S. Application Data

(63) Continuation of application No. 17/593,177, filed as application No. PCT/CN2021/099161 on Jun. 9, 2021, now Pat. No. 12,058,826.

(30) Foreign Application Priority Data

Jun. 2, 2021 (CN) .......................... 202110615565.0

(51) Int. Cl.
*H05K 5/02* (2006.01)
*F16C 11/04* (2006.01)

(52) U.S. Cl.
CPC ............ *H05K 5/0226* (2013.01); *F16C 11/04* (2013.01)

(58) Field of Classification Search
CPC .... G06F 1/1681; G06F 1/1652; G06F 1/1616; G06F 1/16; G06F 1/1641; G06F 1/1601;
(Continued)

(56) References Cited

U.S. PATENT DOCUMENTS 9,348,450 B1* 5/2016 Kim ..................... H04M 1/0268
11,609,606 B2* 3/2023 Myeong ................ G06F 1/1681
(Continued)

FOREIGN PATENT DOCUMENTS

CN 105096756 A 11/2015
CN 105830140 A 8/2016
(Continued)

OTHER PUBLICATIONS

Chinese Office Action issued in corresponding Chinese Patent Application No. 202110871729.6 dated Jun. 12, 2024, pp. 1-9.
(Continued)

*Primary Examiner* — Michael A Matey
(74) *Attorney, Agent, or Firm* — PV IP PC; Wei Te Chung (57) ABSTRACT

A hinge, a display panel, and an electronic device are disclosed. The hinge includes a fixed bracket and a supporting mechanism, wherein the supporting mechanism includes a first supporting element rotatably connected to the fixed bracket along a first shaft, a second supporting element rotatably connected to the first supporting element along a second shaft, a third supporting element rotatably connected to the fixed bracket along a third shaft, and a fourth supporting element rotatably connected to the third supporting element along a fourth shaft.

16 Claims, 8 Drawing Sheets

(58) Field of Classification Search
CPC ... G06F 1/1618; G06F 1/1637; H05K 5/0226; H05K 5/0217; H04M 1/0268; H04M 1/022; F16C 11/04
See application file for complete search history.

(56) References Cited

U.S. PATENT DOCUMENTS

| | | | |
|---|---|---|---|
| 2012/0243207 A1* | 9/2012 | Wang | G09F 9/301 362/97.1 |
| 2015/0330614 A1* | 11/2015 | Lee | B65D 85/38 206/45.23 |
| 2017/0192460 A1* | 7/2017 | Watanabe | G02F 1/133305 |
| 2018/0146560 A1* | 5/2018 | Chen | G06F 1/1626 |
| 2021/0250431 A1* | 8/2021 | Park | G06F 1/1652 |
| 2021/0318723 A1* | 10/2021 | Cheng | G06F 1/1618 |
| 2021/0397228 A1* | 12/2021 | Yang | H04M 1/0216 |
| 2022/0187876 A1* | 6/2022 | Feng | G06F 1/1681 |

FOREIGN PATENT DOCUMENTS

| | | |
|---|---|---|
| CN | 106255935 A | 12/2016 |
| CN | 109637377 A | 4/2019 |
| CN | 110767087 A | 2/2020 |
| CN | 210075297 U | 2/2020 |
| CN | 111681548 A | 9/2020 |
| CN | 112150921 A | 12/2020 |
| CN | 113299195 A | 8/2021 |
| CN | 113404770 A | 9/2021 |
| CN | 216241795 U | 4/2022 |

OTHER PUBLICATIONS

International Search Report in International application No. PCT/CN2021/099161, mailed on Feb. 25, 2022.
Written Opinion of the International Search Authority in International application No. PCT/CN2021/099161, mailed on Feb. 25, 2022.

* cited by examiner

FIG. 11

HINGE, DISPLAY PANEL, AND ELECTRONIC DEVICE

This is a continuation application of U.S. patent application Ser. No. 17/593,177, filed on Sep. 10, 2021, which is incorporated herein by reference in its entirety.

FIELD DISCLOSURE

The present disclosure relates to the field of displays, and in particular to a hinge, a display panel, and an electronic device.

BACKGROUND OF DISCLOSURE

With the development of organic light-emitting diode (OLED) display panel technology, and foldable electronic devices possessing both portability of common electronic devices and ultimate experiences of a large screen display after unfolding, the foldable electronic devices have gradually become an important trend of mobile terminals development and become a field where the major terminal manufacturers compete.

Currently, in the existing foldable electronic devices, a foldable plate and a hinge mechanism are usually employed to achieve a folded state of a flexible screen. However, when driven by the foldable plate or the hinge mechanism, after the flexible screen is folded, a first portion and a second portion on opposite sides of a bending portion of the flexible screen can only be placed in parallel, and thus configurations of the flexible screen are too simple.

SUMMARY OF INVENTION

Technical Problems

The embodiments of the present disclosure provide a hinge, a display panel, and an electronic device to solve defects in the prior art.

Technical Solutions

In order to achieve the above purpose, the technical solutions provided by embodiments of the present disclosure are as below.

A display panel, includes:
a flexible display panel body including a flexible portion, and a first portion and a second portion connected to opposite sides of the flexible portion; and
a hinge including a fixed bracket, a supporting mechanism, and a rotating mechanism, wherein the supporting mechanism includes a first supporting element, a second supporting element, a third supporting element, and a fourth supporting element. The rotating mechanism includes a first connecting element and a second connecting element, wherein the first supporting element is rotatably connected to one side of the fixed bracket along a first shaft, and the second supporting element is rotatably connected to one side of the first supporting element away from the fixed bracket. One end of the first connecting element is rotatably connected to the fixed bracket along a second shaft, and the other end of the first connecting element is rotatably connected to the second supporting element. The third supporting element is rotatably connected to the other side of the fixed bracket along a third shaft, and the fourth supporting element is rotatably connected to one side of the third supporting element away from the fixed bracket. One end of the second connecting element is rotatably connected to the fixed bracket along a fourth shaft, and the other end of the second connecting element is slidably connected to the fourth supporting element.

Upon the supporting mechanism being in a folded state, the flexible portion is in a bending state, the first supporting element and the third supporting element are disposed opposite each other and respectively supporting opposite ends of the flexible portion, the second supporting element and the fourth supporting element are disposed opposite each other and respectively supporting the first portion and the second portion, wherein there is a first included angle between the opposite ends of the flexible portion, there is a second included angle between the first portion and the second portion, and the first included angle is different from the second included angle.

The present disclosure further provides an electronic device including the display panel described in any one of the above.

The present disclosure further provides a hinge, including:
a fixed bracket;
a supporting mechanism and a rotating mechanism, wherein the supporting mechanism includes a first supporting element, a second supporting element, a third supporting element, and a fourth supporting element. The rotating mechanism includes a first connecting element and a second connecting element, wherein the first supporting element is rotatably connected to one side of the fixed bracket along a first shaft, and the second supporting element is rotatably connected to one side of the first supporting element away from the fixed bracket. One end of the first connecting element is rotatably connected to the fixed bracket along a second shaft, and the other end of the first connecting element is rotatably connected to the second supporting element. The third supporting element is rotatably connected to the other side of the fixed bracket along a third shaft, and the fourth supporting element is rotatably connected to one side of the third supporting element away from the fixed bracket. One end of the second connecting element is rotatably connected to the fixed bracket along a fourth shaft, and the other end of the second connecting element is slidably connected to the fourth supporting element.

Upon the supporting mechanism being in a folded state, the first supporting element and the third supporting element are disposed opposite each other, and the second supporting element and the fourth supporting element are disposed opposite each other, wherein a distance between the first supporting element and the third supporting element gradually increases in a direction along the second supporting element and the fourth supporting element pointing to the fixed bracket, a first included angle is between the first supporting element and the third supporting element, a second included angle is between the second supporting element and the fourth supporting element, and the second included angle is less than the first included angle.

Beneficial Effects

The embodiments of the present disclosure provide a display panel, including:

a flexible display panel body including a flexible portion, and a first portion and a second portion connected to opposite sides of the flexible portion; and a hinge including a fixed bracket, a supporting mechanism, and a rotating mechanism, wherein the supporting mechanism includes a first supporting element, a second supporting element, a third supporting element, and a fourth supporting element. The rotating mechanism includes a first connecting element and a second connecting element, wherein the first supporting element is rotatably connected to one side of the fixed bracket along a first shaft, and the second supporting element is rotatably connected to one side of the first supporting element away from the fixed bracket. One end of the first connecting element is rotatably connected to the fixed bracket along a second shaft, and the other end of the first connecting element is rotatably connected to the second supporting element. The third supporting element is rotatably connected to the other side of the fixed bracket along a third shaft, and the fourth supporting element is rotatably connected to one side of the third supporting element away from the fixed bracket. One end of the second connecting element is rotatably connected to the fixed bracket along a fourth shaft, and the other end of the second connecting element is slidably connected to the fourth supporting element. By providing the first supporting element, the second supporting element, the third supporting element, and the fourth supporting element which can rotate relative to each other, upon the supporting mechanism being in a folded state, the flexible portion is in a bending state, the first supporting element and the third supporting element are disposed opposite each other and respectively supporting opposite ends of the flexible portion, and the second supporting element and the fourth supporting element are disposed opposite each other and respectively supporting the first portion and the second portion. There is a first included angle between the opposite ends of the flexible portion, there is a second included angle between the first portion and the second portion, and the first included angle is different from the second included angle. Compared with an existing technique, the hinge provided by the embodiments of the present disclosure has a plurality of degrees of freedom of rotation, so that the flexible display panel body has multiple folding forms.

BRIEF DESCRIPTION OF DRAWINGS

The technical solutions and other beneficial effects of the present disclosure will be obvious by the detailed description of specific embodiments of the disclosure in combination with accompanying drawings as below.

DETAILED DESCRIPTION OF EMBODIMENTS

A hinge, a display panel, and an electronic device are provided in the present disclosure. In order to clearly and specifically illustrate the purpose, technical solutions, and effects of the present disclosure, the present disclosure is further illustrated in details by the figures and embodiments. It is understood that the described embodiments are only used to explain the present disclosure, not used to limit the present disclosure.

Please refer to FIGS. 1-11. A display panel 10 is provided by an embodiment of the present disclosure. The display panel 10 includes a flexible display panel body 100 including a flexible portion 130, and a first portion 110 and a second portion 120 connected to the opposite sides of the flexible portion 120; and a hinge 200 including a fixed bracket 210, a supporting mechanism 220, and a rotating mechanism 230. The supporting mechanism 220 includes a first supporting element 221, a second supporting element 222, a third supporting element 223, and a fourth supporting element 224. The rotating mechanism 230 includes a first connecting element 231 and a second connecting element 232. The first supporting element 221 is rotatably connected to a side of the fixed bracket 210 along a first shaft (not illustrated in the figures), the second supporting element 222 is rotatably connected to a side of the first supporting element 221 away from the fixed bracket 210, an end of the first connecting element 231 is rotatably connected to the fixed bracket 210 along a second shaft 233, and the other end of the first connecting element 231 is slidably connected to the second supporting element 222. The third supporting element 223 is rotatably connected to the other side of the fixed bracket 210 along a third shaft (not illustrated in the figures), the fourth supporting element 224 is rotatably connected to a side of the third supporting element 223 away from the fixed bracket 210, an end of the second connecting element 232 is rotatably connected to the fixed bracket 210 along a fourth shaft 234, and the other end of the second connecting element 232 is slidably connected to the fourth supporting element 224.

Figure 2:
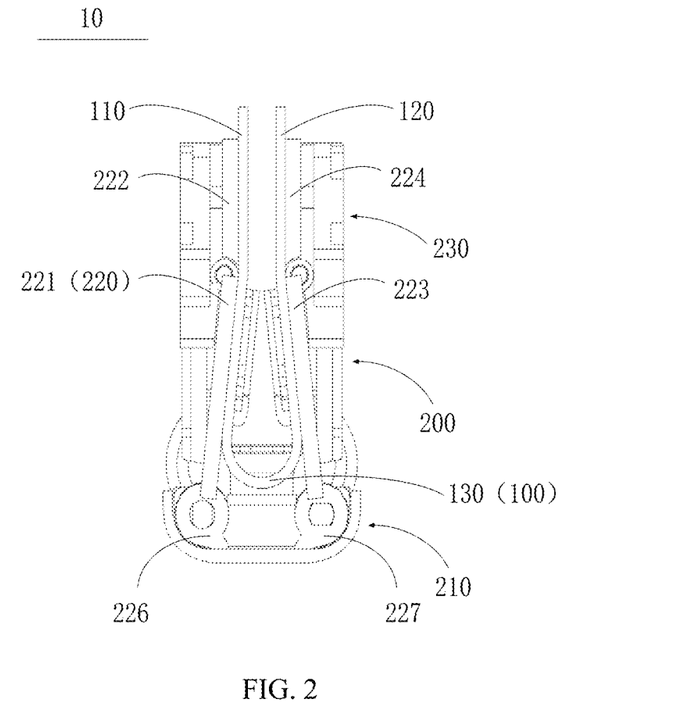
FIG. 2 is a schematic view of a folded state of a display panel provided by an embodiment of the present disclosure.

Upon the supporting mechanism 220 being in a folded state, the flexible portion 130 is in a bending state, the first supporting element 221 and the third supporting element 223 are disposed opposite each other and respectively supporting opposite ends of the flexible portion 130, and the second supporting element 222 and the fourth supporting element 224 are disposed opposite each other and respectively supporting the first portion 110 and the second portion 120, wherein there is a first included angle between opposite ends of the flexible portion 130, there is a second included angle between the first portion 110 and the second portion 120, and the first included angle is different from the second included angle.

Figure 1:
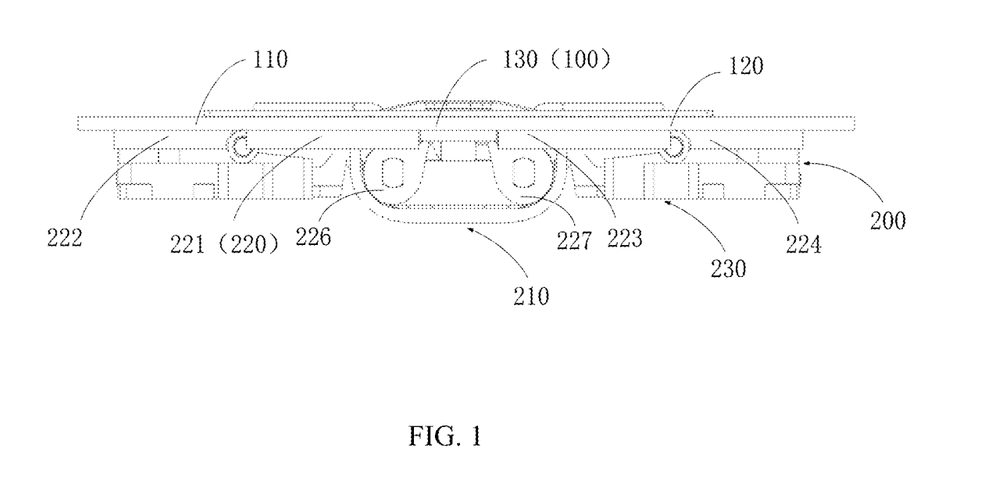
FIG. 1 is a schematic view of an unfolded state of a display panel provided by an embodiment of the present disclosure.

In the embodiments of the present disclosure, upon the supporting element 220 switching from the state shown in FIG. 1 to the state shown in FIG. 2, which means upon the display panel 10 being in the folded state, the first supporting element 221, the second supporting element 222, the third supporting element 223, and the fourth supporting element 224 are inclined to form a wedge shape. Compared with a manner of middle supporting elements and two side supporting elements fixing to each other in the existing technique, spaces for receiving the flexible display panel body 100 are increased in the present disclosure, so that upon the flexible display panel body 100 being in the folded state, a great radian can be employed to bend (such as water drop shapes), so as to improve a folded condition of the flexible display panel body 100, and prevent small folds from damaging the flexible display panel body 100.

The technical solutions of the present disclosure are described in combination with specific embodiments.

FIG. 1 is a schematic view of an unfolded state of a display panel provided by an embodiment of the present disclosure. FIG. 2 is a schematic view of a folded state of a display panel provided by an embodiment of the present disclosure.

Please refer to FIG. 1 and FIG. 2 together. The present embodiments provide a display panel 10. The display panel 10 includes a flexible display panel body 100, the flexible display panel body 100 includes a flexible portion 130, and a first portion 110 and a second portion 120 connected to opposite sides of the flexible portion 130; and a hinge 200, the hinge 200 includes a fixed bracket 210, a supporting mechanism 220, and a rotating mechanism 230.

Figure 3:
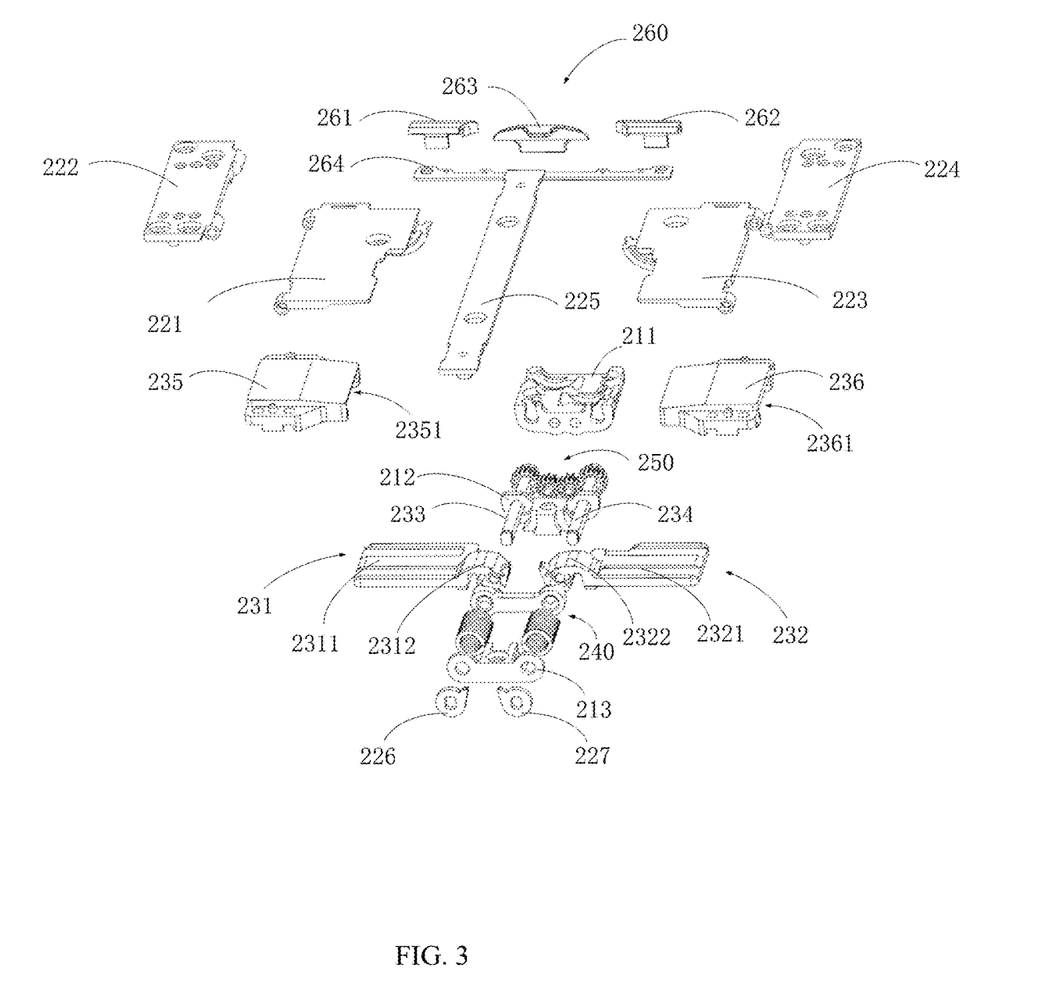
FIG. 3 is an exploded schematic view of a hinge of a display panel provided by an embodiment of the present disclosure.
Figure 4:
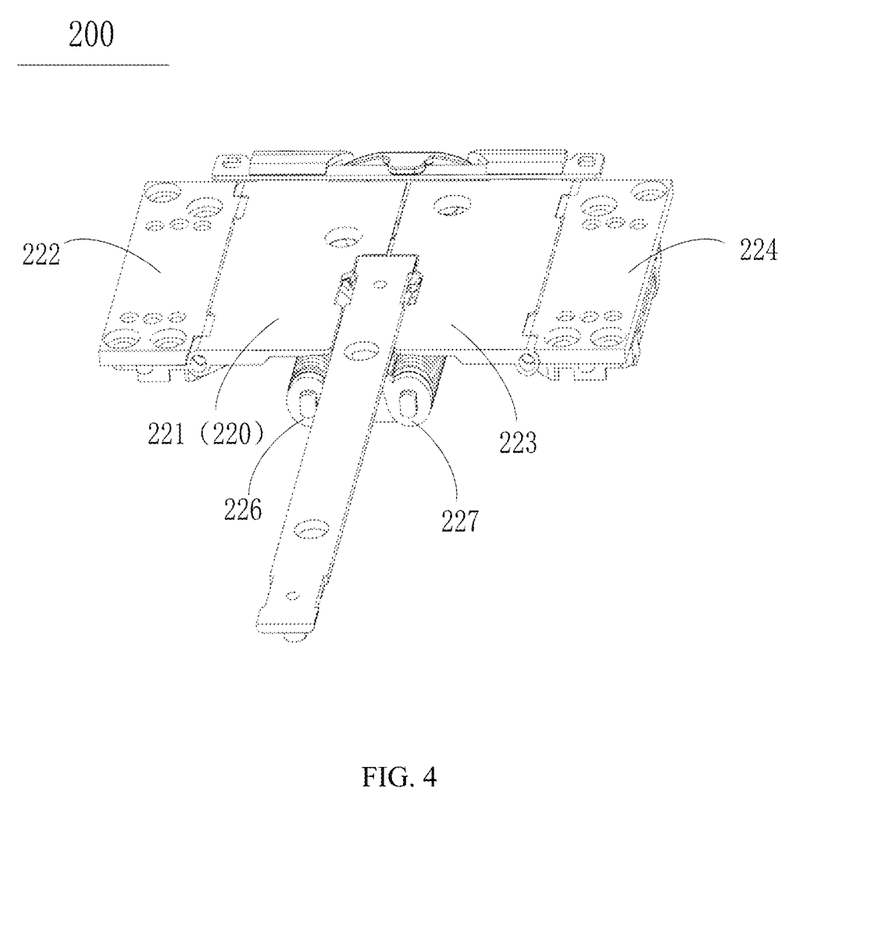
FIG. 4 is a schematic view of a hinge of a display panel in an unfolded state provided by an embodiment of the present disclosure.
Figure 5:
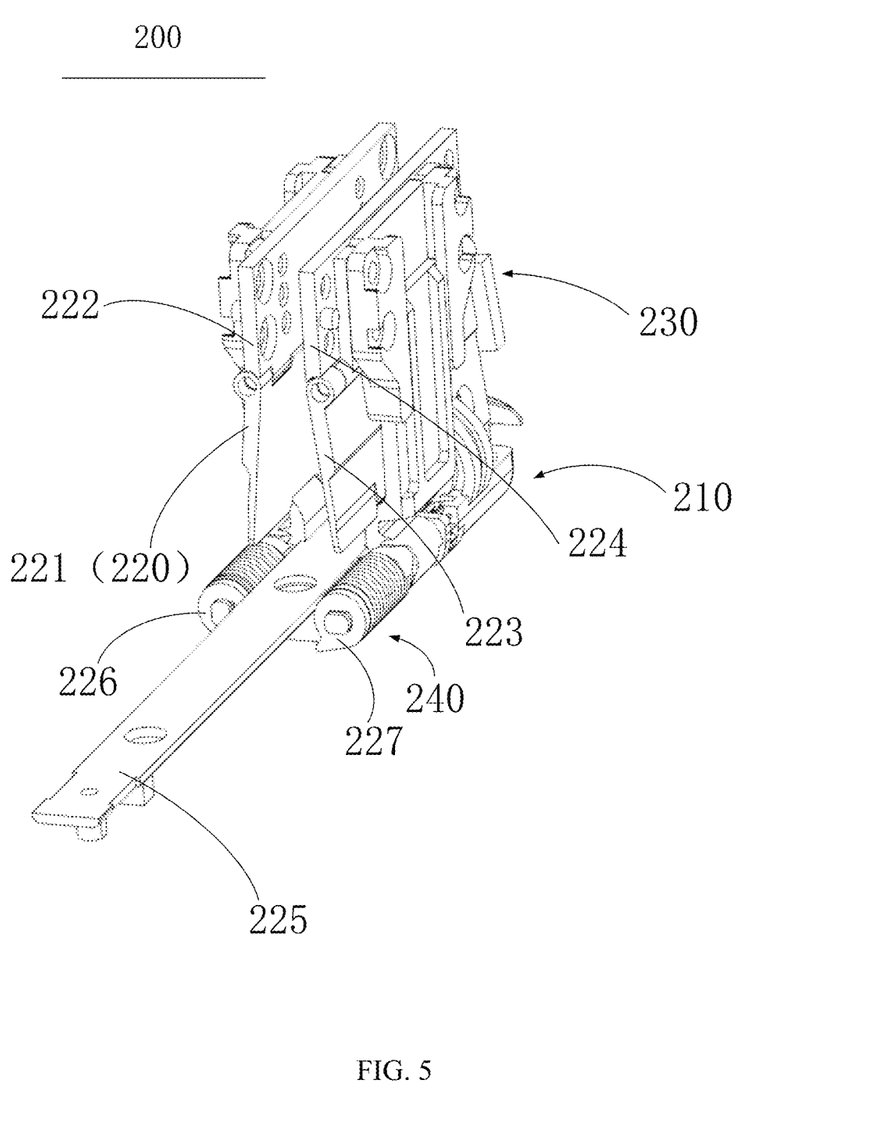
FIG. 5 is a schematic view of a hinge of a display panel in a folded state provided by an embodiment of the present disclosure.
Figure 6:
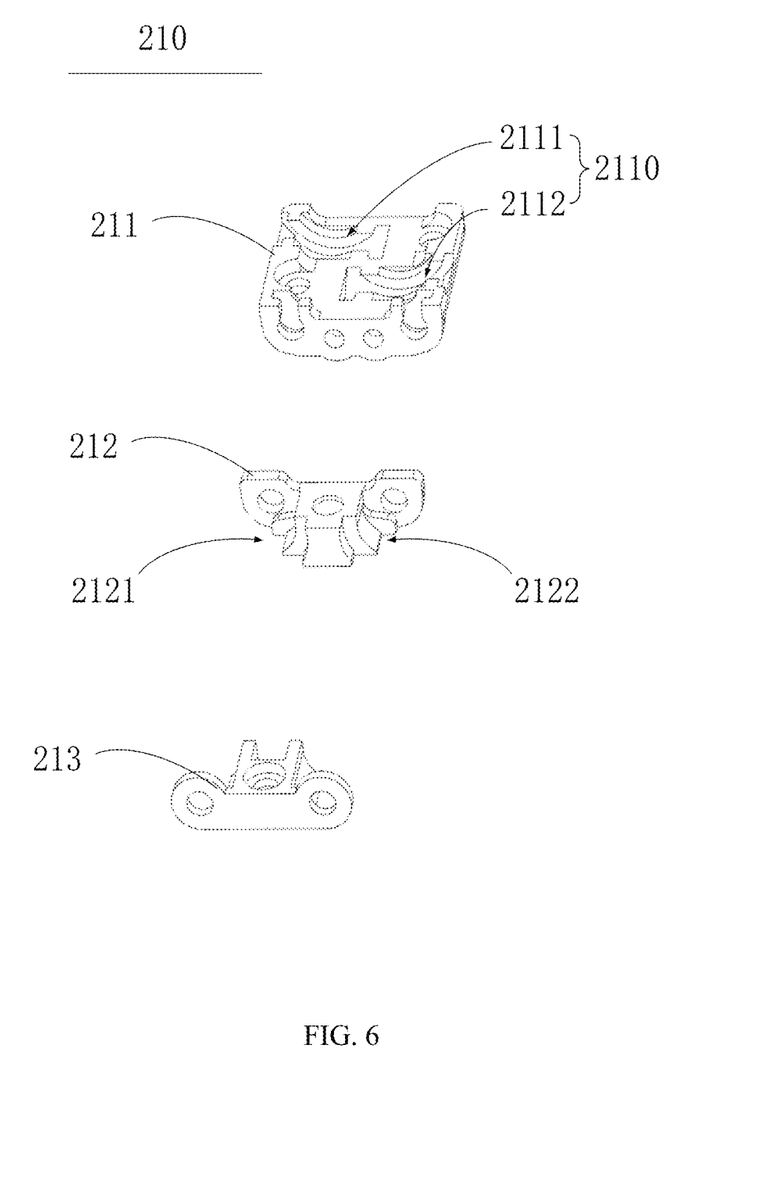
FIG. 6 is a schematic view of a fixed bracket of a hinge of a display panel provided by an embodiment of the present disclosure.
Figure 7:
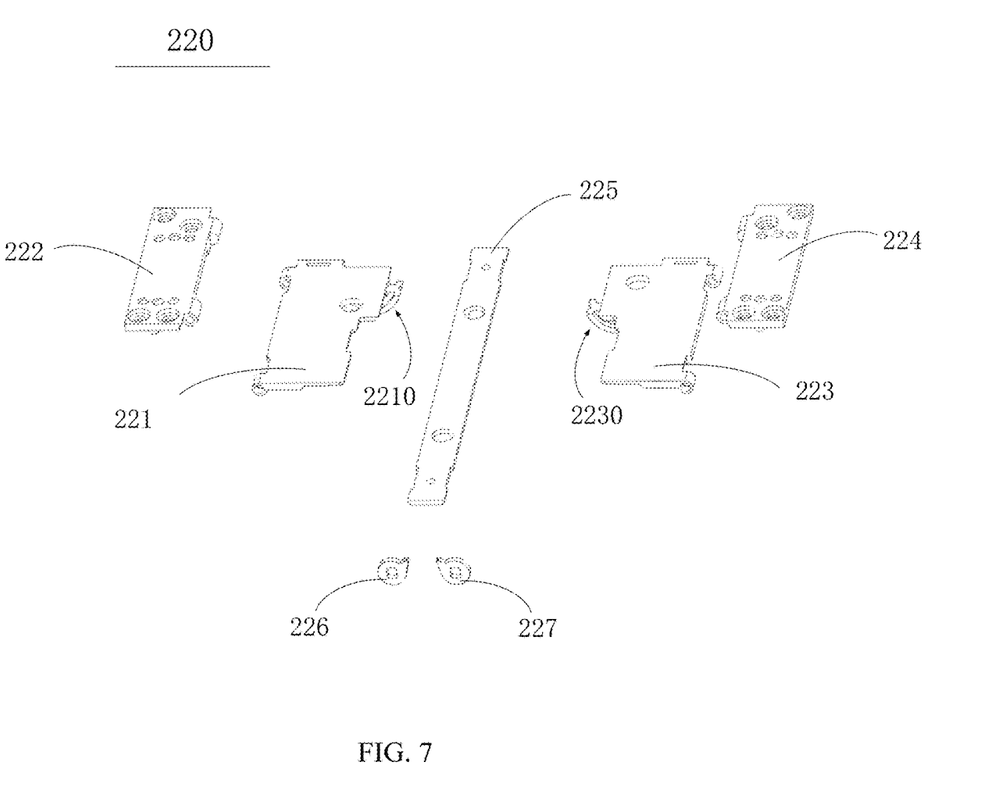
FIG. 7 is a schematic view of a supporting mechanism of a hinge of a display panel provided by an embodiment of the present disclosure.

FIG. 3 is an exploded schematic view of a hinge of a display panel provided by an embodiment of the present disclosure. FIG. 4 is a schematic view of a hinge of a display panel in an unfolded state provided by an embodiment of the present disclosure. FIG. 5 is a schematic view of a hinge of a display panel in a folded state provided by an embodiment of the present disclosure. FIG. 6 is a schematic view of a fixed bracket of a hinge of a display panel provided by an embodiment of the present disclosure. FIG. 7 is a schematic view of a supporting mechanism of a hinge of a display panel provided by an embodiment of the present disclosure.

Specifically, please refer to FIGS. 3-7 together. In the present embodiments, the supporting mechanism 220 includes a first supporting element 221, a second supporting element 222, a third supporting element 223, and a fourth supporting element 224. The rotating mechanism 230 includes a first connecting element 231 and a second connecting element 232. The first supporting element 221 is rotatably connected to a side of the fixed bracket 210 along a first shaft (not illustrated in the figures), and the second supporting element 222 is rotatably connected to a side of the first supporting element 221 away from the fixed bracket 210. An end of the first connecting element 231 is rotatably connected to the fixed bracket 210 along a second shaft 233, and the other end of the first connecting element 231 is slidably connected to the second supporting element 222. The third supporting element 223 is rotatably connected to the other side of the fixed bracket 210 along a third shaft (not illustrated in the figures). The fourth supporting element 224 is rotatably connected to a side of the third supporting element 223 away from a side of the fixed bracket 210. An end of the second connecting element 232 is rotatably connected to the fixed bracket 210 along a fourth shaft 234, and the other end of the second connecting element 232 is slidably connected to the fourth supporting element 224.

It is noted that the materials of the first connecting element 231, the second connecting element 232, the first supporting element 221, the second supporting element 222, the third supporting element 223, and the fourth supporting element 224 are included but not limited to steel materials, which is not specifically limited in the present embodiments. Moreover, the first shaft, the second shaft, the third shaft, and the fourth shaft as described in the present embodiments can be virtual shafts or physical shafts. The second shaft 233 and the first shaft are not in the same axis, and the fourth shaft 234 and the third shaft are not in the same axis.

It is noted that in the present embodiments, the second shaft 223 is fixedly connected to the fixed bracket 210, the end of the first connecting element 231 is rotatably connected to the second shaft 233, the fourth shaft 234 is fixedly connected to the fixed bracket 210, and the end of the second connecting element 232 is rotatably connected to the fourth shaft 234. Alternatively, the second shaft 233 is rotatably connected to the fixed bracket 210, the end of the first connecting element 231 is connected to the second shaft 233, the fourth shaft 234 is rotatably connected to the fixed bracket 210, and the end of the second connecting element 232 is connected to the fourth shaft 234. That is, the first connecting element 231 may be fixedly or movably connected to the second shaft 233, and the second connecting element 232 may be fixedly or movably connected to the fourth shaft 234, which are not specifically limited in the present embodiments.

In the present embodiments, the other end of the first connecting element 231 may achieve to slidably connect to the second supporting element 222 by cooperation between a pin shaft and a sliding groove, and the other end of the second connecting element 232 may achieve to slidably connect to the fourth supporting element 224 by cooperation between the pin shaft and the sliding groove.

In the present embodiments, the first supporting element 221 and the second supporting element 222 surround a first rotating shaft (not illustrated in the figures), and the third supporting element 223 and the fourth supporting element 224 surround a second rotating shaft (not illustrated in the figures). The first supporting element 221 and the second supporting element 222 achieve a movable connection through the first rotating shaft, the third supporting element 233 and the fourth supporting element 224 achieve the movable connection through the second rotating shaft, wherein the first rotating shaft and the second rotating shaft are included but not limited to the pin shafts.

Understandably, the first supporting element 221 and the second supporting element 222 achieving the movable connection through the first rotating shaft, and the third supporting element 223 and the fourth supporting element 224 achieving the movable connection through the second rotating shaft are only illustrated as examples, which are not specifically limited in the present embodiments.

In the present embodiments, by the first supporting element 221 and the second supporting element 222 disposed on a side of the fixed bracket 210, the third supporting element 223 and the fourth supporting element 224 disposed on the other side of the fixed bracket 210, wherein the first supporting element 221 is rotatably connected to a side of the fixed bracket 210 along the first shaft (not illustrated in the figures), the third supporting element 223 is rotatably connected to the other side of the fixed bracket 210 along the third shaft (not illustrated in the figures), the first supporting element 221 and the second supporting element 222 achieve the movable connection through the first rotating shaft, and the third supporting element 223 and the fourth supporting element 224 achieve the movable connection through the second rotating shaft, thereby increasing the amounts of the rotational degree of freedom in the hinge 200. Upon the display panel 10 being in the folded state, the supporting mechanism 220 can achieve a fully close, and further causes the flexible panel body 100 in the display panel 10 to be fully closed and fully unfolded.

Figure 8:
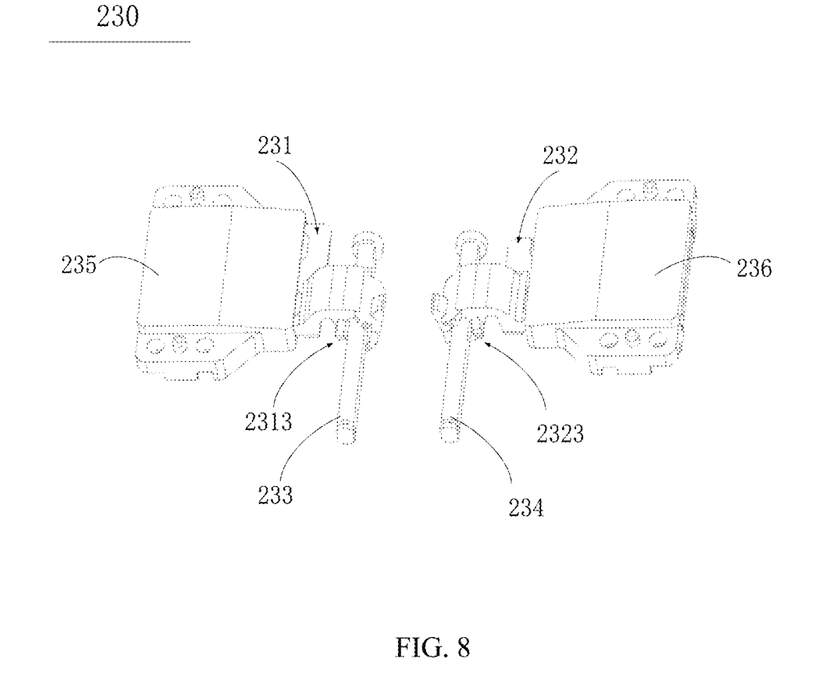
FIG. 8 is a schematic view of a rotating mechanism of a hinge of a display panel provided by an embodiment of the present disclosure.

FIG. 8 is a schematic view of a rotating mechanism 230 of a hinge of a display panel provided by an embodiment of the present disclosure.

Please refer to FIG. 3, FIG. 5, and FIG. 8 together. In the present embodiments, the second supporting element 222 is slidably connected to the fixed bracket 210, and the fourth supporting element 224 is slidably connected to the fixed bracket 210.

In the present embodiments, the rotating mechanism 230 includes a first mounting element 235 and a second mounting element 236, the first mounting element 235 is provided with a first sliding groove 2351, and the second mounting element 236 is provided with a second sliding groove 2361.

The first mounting element 235 is fixedly connected to the second supporting element 222, and the other end of the first connecting element 231 is slidably mounted in the first sliding groove 2351 of the first mounting element 235. The second mounting element 236 is fixedly connected to the fourth supporting element 224, and the other end of the second connecting element 232 is slidably mounted in the second sliding groove 2361 of the second mounting element 236.

Understandably, in the present embodiments, the first mounting element 235 and the second mounting element 224 may be an integrally formed structure or achieve a fixed connection by fixed components, and the second mounting element 236 and the fourth supporting element 224 may be the integrally formed structure or achieve the fixed connection by fixed components, which are not further limited in the present embodiments.

It is noted that the second shaft 233 and the fourth shaft 234 are included but limited to gear shafts, and the materials of the first mounting element 235 and the second mounting element 236 are included but not limited to steel materials, which are not specifically limited in the present embodiments.

In the present embodiments, the first connecting element 231 includes a first body portion 2311 and a first extension portion 2312 extending from an end of the first body portion 2311, and the second connecting element 232 includes a second body portion 2321 and a second extension portion 2322 extending from an end of the second body portion 2321. The first body portion 2321 is slidably connected in the first sliding groove 2351 of the first mounting element 235, the first extension portion 2312 is provided with a first hole for the second shaft 233 to pass (not illustrated in the figures), the second body portion 2321 is slidably mounted in the second sliding groove 2361 of the second mounting element 236, and the second extension portion 2322 is provided with a second hole for the fourth shaft 234 to pass (not illustrated in the figures).

Specifically, an end of the first connecting element 231 is rotatably connected to the fixed bracket 210 by the second shaft 233, and the other end of the first connecting element 231 is slidably connected to the second supporting element 222 by the first mounting element 235. An end of the second connecting element 232 is rotatably connected to the fixed bracket 210 by the fourth shaft 234, and the other end of the second connecting element 232 is slidably connected to the fourth supporting element 224 by the second mounting element 236.

Please refer to FIG. 5 to FIG. 8 together. In the present embodiments, the fixed bracket 210 includes a body bracket 211 and a first bracket 212, wherein the second shaft 233 and the fourth shaft 234 are rotatably connected to the body bracket 211, the first bracket 212 surrounds the second shaft 233 and the fourth shaft 234, the first bracket 212 is provided with a first recess 2121 and a second recess 2122, the first extension portion 2312 is rotatably received in the first recess 2121, and the second extension portion 2322 is rotatably received in the second recess 2122.

It is noted that the materials of the body bracket 211 and the first bracket 212 are included but not limited to steel materials, which are not specifically limited in the present embodiments.

In the present embodiments, the body bracket 211 includes an arc-shaped sliding groove 2110, the first supporting element 221 includes a first slider 2210, the third supporting element 223 includes a second slider 2230, wherein the first slider 2210 and the second slide 2230 rotate in the arc-shaped sliding groove 2110.

Further, the body bracket 211 includes a first circular arc-shaped sliding groove 2111 and a second circular arc-shaped sliding groove 2112, bottoms of the first slider 2210 and the second slider 2230 appear in circular arc-shaped structures, wherein the first slider 2210 cooperates with the first circular arc-shaped sliding groove 2111, and the second slider 2230 cooperates with the second circular arc-shaped sliding groove 2112. The change of the relative position relationship between the first slider 2210 and the second slider 2230 brings the change of the relative position relationship between the first support 221 and the second support 222.

In the present embodiments, the first circular arc-shaped sliding groove 2111 and the second circular arc-shaped sliding groove 2112 define a rotating direction of the first slider 2210 and the second slider 2230, so as to avoid unnecessary motion tracks upon the first supporting element 221 and the third supporting element 223 rotating.

Understandably, the body bracket 211 includes the arc-shaped sliding groove 2110, the first supporting element 221 includes the first slider 2210, the third supporting element 223 includes the second slider 2230, wherein the first slide 2210 and the second slide 2230 rotating in the arc-shaped sliding groove 2110 are only illustrated as examples. The rotating connection manners of the body bracket 211, the first supporting element 211, and the third supporting element 223 are not limited in the present embodiments. Similarly, the body bracket 211 including the first circular arc-shaped sliding groove 2111 and the second circular arc-shaped sliding groove 2112, and the bottoms of the first slider 2210 and the second slider 2230 appearing in circular arc-shaped structures are only illustrated as examples, which are not limited in the present embodiments.

It is noted that in the present embodiments, in a direction along the first supporting element 221 pointing to the third supporting element 223, a length of an orthographic projection of the first circular arc-shaped sliding groove 2111 and the second circular arc-shaped sliding groove 2112 projected on the body bracket 211 is lesser than 8 mm, so as to assure the motion tracks of the first supporting element 221 and the second supporting element 222 not causing excessive stress on the flexible display panel body 100, and prevent the flexible display panel body 100 from being damaged.

Please refer to FIG. 1 and FIG. 2 together. In the present embodiments, upon the supporting mechanism 220 being in a flat state, the flexible portion is in a flat state, wherein the first supporting element 221, the second supporting element 222, the third supporting element 223, and the fourth supporting element 224 collectively support the first portion 110, the second portion 120, and the flexible portion 130.

Upon the supporting mechanism 220 being in a folded state, the flexible portion 130 is in a bending state, the first supporting element 221 and the third supporting element 223 are disposed opposite each other and respectively supporting opposite ends of the flexible portion 130, and the second supporting element 222 and the fourth supporting element 224 are disposed opposite each other and respectively supporting the first portion 110 and the second portion 120. There is a first included angle between the opposite ends of the flexible portion 130, there is a second included angle between the first portion 110 and the second portion 120, and the first included angle is different from the second included angle.

Further, upon the supporting mechanism 220 being in the folded state, a distance between the opposite ends of the flexible portion 130 gradually increases in a direction along the second supporting element 222 and the fourth supporting element 224 pointing to the fixed bracket 210, and the second included angle is less than the first included angle.

Specifically, in the present embodiments, the first included angle is an acute angle, and the second included angle is an acute angle or a 0° angle. Understandably, it is not specifically limited in the present embodiments.

In the present embodiments, upon the display panel 10 switching from the state shown in FIG. 1 to the state shown in FIG. 2, which means upon the display panel 10 being in the folded state, the first supporting element 221, the second supporting element 222, the third supporting element 223, and the fourth supporting element 224 are inclined to form a wedge shape. Compared with a manner of middle supporting elements and two side supporting elements fixing to each other in the existing technique, the spaces for receiving the flexible display panel body 100 are increased in the present disclosure, so that upon the flexible display panel body 100 being in the folded state, a great radian can be employed to bend (such as water drop shapes), so as to improve a folded condition of the flexible display panel body 100, and prevent small folds from damaging the flexible display panel body 100.

Please refer to FIGS. 3-8 together. In the present embodiments, the supporting mechanism 220 includes a fifth supporting element 225, a sixth supporting element 226, a seventh supporting element 227. The fifth supporting element 225 is movably connected to the fixed bracket 210, the first supporting element 221 and the second supporting element 222 are located on one side of the fifth supporting element 225, the third supporting element 223 and the fourth supporting element 224 are located on the other side of the fifth supporting element 225, and the sixth supporting element 226 and the seventh supporting element 227 are movably connected to the body bracket 211.

Upon the supporting mechanism 220 being in the flat state, the sixth supporting element 226 and the seventh supporting element 227 support the fifth supporting element 225, and the fifth supporting element 225 is away from the fixed bracket 210. The first supporting element 221, the second supporting element 222, the third supporting element 223, the fourth supporting element 224, and the fifth supporting element 225 collectively form a flat surface. Upon the supporting mechanism 220 being in the folded state, the fifth supporting element 225 is close to the fixed bracket 210.

It is noted that the materials of the fifth supporting element 225, the sixth supporting element 226, and the seventh supporting element 227 are included but not limited to steel materials, which are not specifically limited in the present embodiments.

Further, the sixth supporting element 226 includes a protrusion (not illustrated in the figures), and the seventh supporting element 227 includes a protrusion (not illustrated in the figures), wherein the sixth supporting element 226 is fixedly connected to the second shaft 233, and the seventh supporting element 227 is fixedly connected to the fourth shaft 234. Upon the supporting mechanism 220 being in the flat state, the protrusion supports the fifth supporting element 225. Upon the supporting mechanism 220 being in the folded state, there is a gap between the protrusion and the fifth supporting element 225. Understandably, the shapes of the protrusion are not further limited in the present embodiments.

In the present embodiments, the fixed bracket 210 further includes a second bracket 213, wherein the second bracket 213 surrounds the second shaft 233 and the fourth shaft 234. The sixth supporting element 226 and the seventh supporting element 227 are located on one side of the first bracket 212 away from the body bracket 211. The second bracket 213 is located between the sixth supporting element 226, the seventh supporting element 227, and the first bracket 212. The sixth supporting element 226 and the seventh supporting element 227 abut against the second bracket 213.

It is noted that the materials of the second bracket 213 are included but not limited to steel materials, which is not specifically limited in the present embodiments.

In the present embodiments, the sixth supporting element 226 and the seventh supporting element 227 play a role in supporting the fifth supporting element 225. Moreover, the sixth supporting element 226 and the seventh supporting element 227 abut against the second bracket 213, thereby preventing the second bracket 213 from separating the second shaft 233 from the fourth shaft 234, and maintaining the stability of the hinge 200.

In the present embodiments, upon the supporting mechanism 220 being in the flat state, an orthographic projection of the protrusion projected on the second bracket 213 is beyond a boundary of the second bracket 213. Upon the supporting mechanism 220 being in the folded state, an orthographic projection of the protrusion projected on the second bracket 213 is within a boundary of the second bracket 213, thereby achieving a free elevation of the fifth supporting element 225 relative to the fixed bracket 210. Furthermore, the spaces for receiving the flexible display panel body 100 is increased, so that upon the flexible display panel body 100 being in the folded state, a great radian can be employed to bend, so as to improve a folded condition of the flexible display panel body 100, and prevent small folds from damaging the flexible display panel body 100.

Further, in the present embodiments, the fifth supporting element 225 is slidably connected to the first bracket 212 and the second bracket 213, so as to limit the fifth supporting element 225 to slide in a straight line perpendicular to the fixed bracket 210, and prevent the fifth supporting element 225 from moving in other directions. The fifth supporting element 225 is connected to the first bracket 212 by a first elastic element (not illustrated in the figures). Upon the supporting mechanism 220 being in the folded state or the flat state, the first elastic element is in an elastic deformation state, which means the first elastic element generates a tensile force that causes the fifth supporting element 225 to move toward the first bracket 212.

In the present embodiments, the first elastic element is included but not limited to springs. It is noted that the fifth supporting element 225 connected to the first bracket 212 through a first elastic element is only illustrated as an example. The connection manners of the fifth supporting element 225 and the first bracket 212 are not specifically limited in the present embodiments. For instance, the fifth supporting element 225 includes a magnetic suction element, the first bracket 212 includes a magnetic element, and the fifth supporting element 225 is magnetically connected to the first bracket 212 through the magnetic suction element and the magnetic element. Understandably, the positions of the magnetic suction element and the magnetic element may be exchanged.

Figure 9:
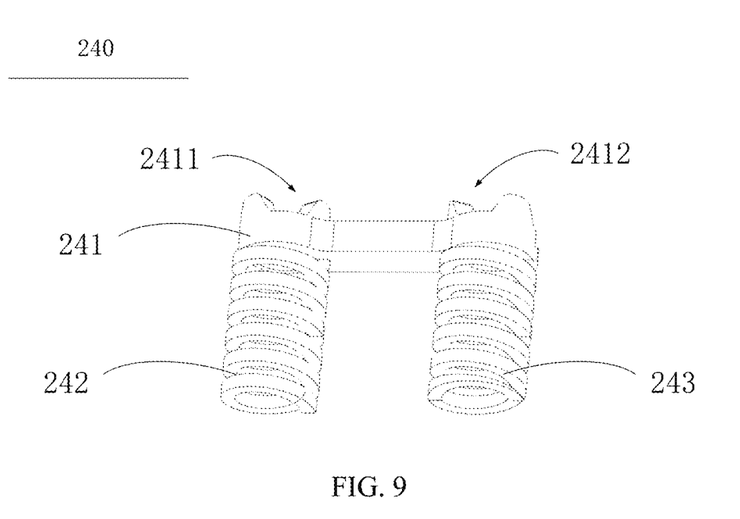
FIG. 9 is a schematic view of a positioning mechanism of a hinge of a display panel provided by an embodiment of the present disclosure.
Figure 10:
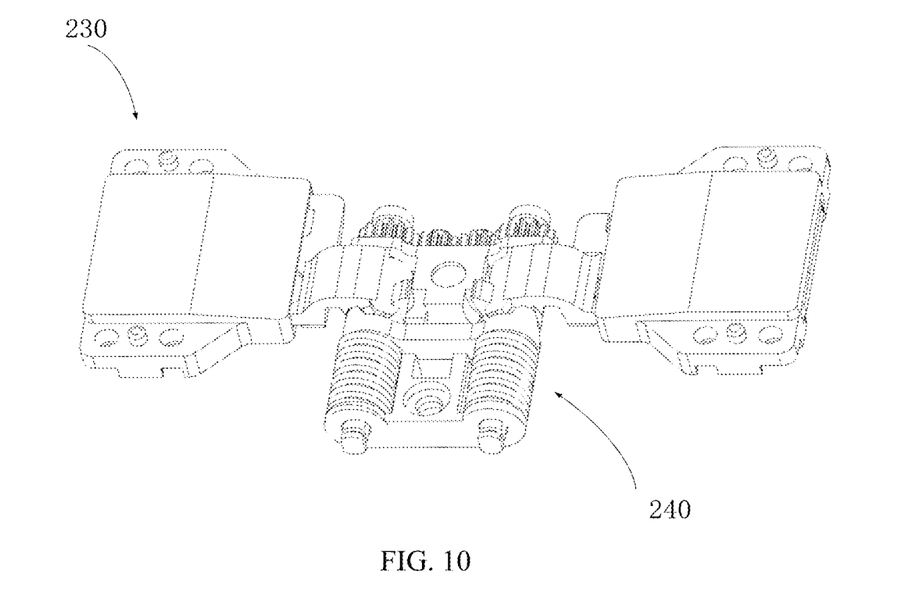
FIG. 10 is a schematic view of a rotating mechanism cooperating with a positioning mechanism of a hinge of a display panel provided by an embodiment of the present disclosure.

FIG. 9 is a schematic view of a positioning mechanism 240 of a hinge of a display panel provided by an embodiment of the present disclosure. FIG. 10 is a schematic view of a rotating mechanism cooperating with a positioning mechanism of a hinge of a display panel provided by an embodiment of the present disclosure.

Please refer to FIGS. 3-10 together. In the present embodiments, the hinge 200 further includes a positioning mechanism 240, the positioning mechanism 240 includes a positioning element 241, wherein the positioning element 241 surrounds the second shaft 233 and the fourth shaft 234. The positioning element 241 includes a first protrusion 2411 of the first extension portion 2312 toward the first connecting element 231, and a second protrusion 2412 of the second extension portion 2322 toward the second connecting element 232. The first extension portion 2312 of the first connecting element 231 is provided with a first groove 2313, and the second extension portion 2322 of the second connecting element 232 is provided with a second groove 2323. Upon the supporting mechanism 220 being in the flat state or the folded state, the first protrusion 2411 is received in the first groove 2313, and the second protrusion 2412 is received in the second groove 2323.

The positioning mechanism 240 further includes a second elastic element 242 and a third elastic element 243, wherein the second elastic element 242 surrounds the second shaft 233, one end of the second elastic element 242 is connected to the positioning element 241, and the other end of the second elastic element 242 is connected to the second bracket 213. The third elastic element 243 surrounds the fourth shaft 234, one end of the third elastic element 243 is connected to the positioning element 241, and the other end of the third elastic element 243 is connected to the second bracket 213. Upon the supporting mechanism 220 being in the folded state or the flat state, the second elastic element 242 and the third elastic element 243 are in an elastic deformation state.

In the present embodiments, upon the second shaft 233 rotating, the first groove 2313 rotates accordingly, and the first protrusion 2411 is received in the first groove 2313. Upon the fourth shaft 234 rotating, the second groove 2323 rotates accordingly, and the second protrusion 2412 is received in the second groove 2323. Through the cooperation of the rotating mechanism 230 and the positioning mechanism 240, upon the hinge 200 folding, it can achieve that when the second shaft 233 and the fourth shaft 234 rotate from the unfolded state to 0-108, the hinge 200 automatically returns to the unfolded position; and when the second shaft 233 and the fourth shaft 234 rotate from the unfolded state to 80-90°, the hinge 200 automatically returns to the folded position, which means a 90° position, thereby improving user experiences.

It is noted that the materials of the positioning 241 are included but not limited to steel materials. The second elastic element 242 and the third elastic element 243 are included but not limited to strings, which is not specifically limited in the present embodiments.

Figure 11:
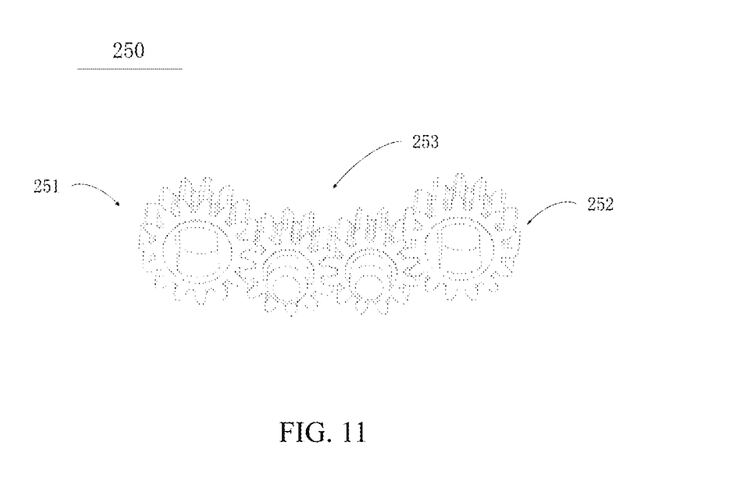
FIG. 11 is a schematic view of a synchronization mechanism of a hinge of a display panel provided by an embodiment of the present disclosure.

FIG. 11 is a schematic view of a synchronization mechanism 250 of a hinge of a display panel provided by an embodiment of the present disclosure.

Please refer to FIGS. 3-11 together. In the present embodiments, the display panel 10 further includes a synchronization mechanism 250, and the synchronization mechanism 250 includes a first synchronous member 251, a second synchronous member 252, and a third synchronous member 253. The first synchronous member 251 is connected to the second shaft 233, the second synchronous member 252 is connected to the fourth shaft 234, and the first synchronous member 251 is synchronously connected to the second synchronous member 252 by the third synchronous member 253 to synchronously rotate the second shaft 233 and the fourth shaft 234.

In the present embodiments, the synchronization mechanism 250 cooperates with the rotating mechanism 230 and the positioning mechanism 240. Driven by the synchronization mechanism 250 and the rotating mechanism 230, the first supporting element 221, the second supporting element 222, the third supporting element 223, and the fourth supporting element 224 synchronously rotate along the fixed bracket 210 respectively, so as to improve the consistency and the stability of the movements of the first supporting element 221 and the second supporting element 222 with the third supporting element 223 and the fourth supporting element 224, and further improve the stability of the hinge 200.

Further, driven by the synchronization mechanism 250 and the rotating mechanism 230, the first slider 2210 and the second slider 2230 respectively rotate relative to the first circular arc-shaped sliding groove 2111 and the second circular arc-shaped sliding groove 2112 in the body bracket 211, thereby achieving the changes of states of the hinge 200.

Specifically, the first synchronous member 251 includes a first gear, the second synchronous member 252 includes a second gear, and the third synchronous member 253 includes two third gears engaging each other, wherein the two third gears are rotatably connected to the body bracket 211 and the first bracket 212, the first gear surrounds the second shaft 233, the second gear surrounds the fourth shaft 234, the first gear engages one of the two third gears, and the second gear engages the other one of the two third gears.

It is noted that the first synchronous member 251 including a first gear, the second synchronous member 252 including a second gear, and the third synchronous member 253 including two third gears engaging each other are only illustrated as examples. The types of the synchronization mechanism 250 are not specifically limited in the present embodiments.

Please refer to FIG. 1 and FIG. 3 together. In the present embodiments, the display panel 10 further includes a dust-proof structure 260, and the dust-proof structure 260 is disposed on a junction of the fixed bracket 210 and the supporting mechanism 222. Further, the dust-proof structure 260 is located on a side of the first supporting element 221, the second supporting element 222, the third supporting element 223, and the fourth supporting element 224 away from the fifth supporting element 225, and the dust-proof structure 260 covers at least part of the flexible display panel body 100.

Specifically, the dust-proof structure 260 at least includes a first front frame component 261 connecting to the first supporting element 221, a second front frame component 262 connecting to the third supporting element 223, and a dust-proof plug 263 provided corresponding to the flexible display panel body 100 and the flexible portion 130. The dust-proof structure 260 further includes a soft strip 264 disposed between the dust-proof plug 263 and the flexible display panel body 100, the soft strip 264 is respectively connected to the first front frame component 261 and the second front frame component 262, so as to prevent foreign materials from entering a side of the flexible display panel body 100 and causing damages to the flexible display panel body 100.

The present embodiments further provide an electronic device. The electronic device includes the display panel 10 described in any one the above embodiments.

The display panel 100 is described in detail in the embodiments above, and will not be redundantly described.

The present embodiments further provide a hinge 200, the hinge 200 is described in details in the embodiments above, and will not be redundantly described.

In summary, a hinge, a display panel, and an electronic device are disclosed in the present disclosure. The hinge includes a fixed bracket, a supporting mechanism, wherein the supporting mechanism includes a first supporting element, a second supporting element rotatably connected to the first supporting element, a third supporting element, and a fourth supporting element rotatably connected to the third supporting element. The first supporting element and the third supporting element are respectively and rotatably connected to two relative sides of the fixed bracket. Upon the supporting mechanism being in a folded state, the first supporting element and the third supporting element are disposed opposite each other and respectively supporting opposite ends of the flexible portion, the second supporting element and the fourth supporting element are disposed opposite each other and respectively supporting the first portion and the second portion, wherein there is a first included angle between the opposite ends of the flexible portion, there is a second included angle between the first portion and the second portion, and the first included angle is different from the second included angle.

In the embodiments above, the description of each embodiment has its own emphasis. For a part that is not specifically described in a certain embodiment, please refer to the relevant description of other embodiments.

It should be understood by those skilled in the art that they can still equivalently replace or modify some of the technical features based on the technical solutions and technical conceptions of the present disclosure, and these modifications and replacements shall belong to the scope of protection of the claims of the present disclosure.

What is claimed is:

1. A display panel, comprising:
   a flexible display panel body comprising a flexible portion, and a first portion and a second portion connected to opposite sides of the flexible portion; and
   a hinge comprising a fixed bracket, a supporting mechanism, and a rotating mechanism, wherein the supporting mechanism comprises a first supporting element, a second supporting element, a third supporting element, and a fourth supporting element;
   the rotating mechanism comprises a first connecting element and a second connecting element, wherein the first supporting element is rotatably connected to one side of the fixed bracket along a first shaft, the second supporting element is rotatably connected to one side of the first supporting element away from the fixed bracket, one end of the first connecting element is rotatably connected to the fixed bracket along a second shaft, and the other end of the first connecting element is rotatably connected to the second supporting element; the third supporting element is rotatably connected to the other side of the fixed bracket along a third shaft, the fourth supporting element is rotatably connected to one side of the third supporting element away from the fixed bracket, one end of the second connecting element is rotatably connected to the fixed bracket along a fourth shaft, and the other end of the second connecting element is slidably connected to the fourth supporting element;
   wherein upon the supporting mechanism being in a folded state, the flexible portion is in a bending state, the first supporting element and the third supporting element are disposed opposite each other and respectively supporting opposite ends of the flexible portion, the second supporting element and the fourth supporting element are disposed opposite each other and respectively supporting the first portion and the second portion, wherein there is a first included angle between the opposite ends of the flexible portion, there is a second included angle between the first portion and the second portion, and the first included angle is different from the second included angle,
   wherein the second shaft and the fourth shaft are fixedly connected to the fixed bracket,
   wherein the first connecting element comprises a first extension portion, the first extension portion is provided with a first hole for the second shaft to pass, and the second connecting element comprises a second extension portion, the second extension portion is provided with a second hole for the fourth shaft to pass,
   wherein the fixed bracket comprises a body bracket and a first bracket, the first bracket surrounds the second shaft and the fourth shaft, the first bracket is provided with a first recess and a second recess, the first extension portion is rotatably received in the first recess, and the second extension portion is rotatably received in the second recess.

2. The display panel as claimed in claim 1, wherein upon the supporting mechanism being in a flat state, the flexible portion is in the flat state, wherein the first supporting element, the second supporting element, the third supporting element, and the fourth supporting element collectively support the first portion, the second portion, and the flexible portion.

3. The display panel as claimed in claim 2, wherein upon the supporting mechanism being in the folded state, a distance between the opposite ends of the flexible portion gradually increases in a direction along the second supporting element and the fourth supporting element pointing to the fixed bracket, and the second included angle is less than the first included angle.

4. The display panel as claimed in claim 1, wherein the rotating mechanism further comprises a first mounting element and a second mounting element, the first mounting element is provided with a first sliding groove, and the second mounting element is provided with a second sliding groove;

wherein the first mounting element is fixedly connected to the second supporting element, and the other end of the first connecting element is slidably mounted in the first sliding groove of the first mounting element; the second mounting element is fixedly connected to the fourth supporting element, and the other end of the second connecting element is slidably mounted in the second sliding groove of the second mounting element.

5. The display panel as claimed in claim 4, wherein the first connecting element comprises a first body portion and a first extension portion extending from an end of the first body portion, and the second connecting element comprises a second body portion and a second extension portion extending from an end of the second body portion; wherein the first body portion is slidably connected in the first sliding groove of the first mounting element, the second body portion is slidably mounted in the second sliding groove of the second mounting element.

6. The display panel as claimed in claim 5, wherein the fixed bracket comprises a body bracket and a first bracket, wherein the second shaft and the fourth shaft are rotatably connected to the body bracket, the first bracket surrounds the second shaft and the fourth shaft, the first bracket is provided with a first recess and a second recess, the first extension portion is rotatably received in the first recess, and the second extension portion is rotatably received in the second recess.

7. The display panel as claimed in claim 1, wherein the supporting mechanism comprises a fifth supporting element, a sixth supporting element, and a seventh supporting element;

wherein the fifth supporting element is movably connected to the fixed bracket, the first supporting element and the second supporting element are located on one side of the fifth supporting element, the third supporting element and the fourth supporting element are located on the other side of the fifth supporting element, and the sixth supporting element and the seventh supporting element are movably connected to the body bracket;

upon the supporting mechanism being in the flat state, the sixth supporting element and the seventh supporting element support the fifth supporting element, and the fifth supporting element is away from the fixed bracket, wherein the first supporting element, the second supporting element, the third supporting element, the fourth supporting element, and the fifth supporting element collectively form a flat surface;

upon the supporting mechanism being in the folded state, the fifth supporting element is close to the fixed bracket.

8. The display panel as claimed in claim 7, wherein the sixth supporting element comprises a protrusion, and the seventh supporting element comprises a protrusion, wherein the sixth supporting element is fixedly connected to the second shaft, the seventh supporting element is fixedly connected to the fourth shaft;

upon the supporting mechanism being in the flat state, the protrusion supports the fifth supporting element;

upon the supporting mechanism being in the folded state, there is a gap between the protrusion and the fifth supporting element.

9. The display panel as claimed in claim 8, wherein the fixed bracket further comprises a second bracket, wherein the second bracket surrounds the second shaft and the fourth shaft, the sixth supporting element and the seventh supporting element are located on one side of the first bracket away from the body bracket, the second bracket is located between the sixth supporting element, the seventh supporting, and the first bracket; and the sixth supporting element and the seventh supporting element abut against the second bracket.

10. The display panel as claimed in claim 9, wherein upon the supporting mechanism being in the flat state, an orthographic projection of the protrusion projected on the second bracket is beyond a boundary of the second bracket, and upon the supporting mechanism being in the folded state, an orthographic projection of the protrusion projected on the second bracket is within the boundary of the second bracket.

11. The display panel as claimed in claim 9, wherein the fifth supporting element is slidably connected to the first bracket and the second bracket, and the fifth supporting element is connected to the first bracket through a first elastic element, wherein upon the supporting mechanism being in the folded state or the flat state, the first elastic element is in an elastic deformation state.

12. The display panel as claimed in claim 9, wherein the hinge further comprises a positioning mechanism comprising a positioning element, wherein the positioning element surrounds the second shaft and the fourth shaft, the positioning element comprises a first protrusion of the first extension portion toward the first connecting element, and a second protrusion of the second extension portion toward the second connecting element, the first extension portion of the first connecting element is provided with a first groove, and the second extension portion of the second connecting element is provided with a second groove;

upon the supporting mechanism being in the flat state or the folded state, the first protrusion is received in the first groove, and the second protrusion is received in the second groove.

13. The display panel as claimed in claim 12, wherein the positioning mechanism further comprises a second elastic element and a third elastic element, wherein the second elastic element surrounds the second shaft, one end of the second elastic element is connected to the positioning element, the other end of the second elastic element is connected to the second bracket, the third elastic element surrounds the fourth shaft, one end of the third elastic element is connected to the positioning element, and the other end of the third elastic element is connected to the second bracket;

upon the supporting mechanism being in the folded state or the flat state, the second elastic element and the third elastic element are in an elastic deformation state.

14. An electronic device, comprising a display panel, wherein the display panel comprises:

a flexible display panel body comprising a flexible portion, and a first portion and a second portion connected to opposite sides of the flexible portion; and a hinge comprising a fixed bracket, a supporting mechanism, and a rotating mechanism, wherein the supporting mechanism comprises a first supporting element, a second supporting element, a third supporting element, and a fourth supporting element;

the rotating mechanism comprises a first connecting element and a second connecting element, wherein the first supporting element is rotatably connected to one side of the fixed bracket along a first shaft, the second supporting element is rotatably connected to one side of the first supporting element away from the fixed bracket, one end of the first connecting element is rotatably connected to the fixed bracket along a second shaft, and the other end of the first connecting element is rotatably connected to the second supporting element; the third supporting element is rotatably connected to the other side of the fixed bracket along a third shaft, the fourth supporting element is rotatably connected to one side of the third supporting element away from the fixed bracket, one end of the second connecting element is rotatably connected to the fixed bracket along a fourth shaft, and the other end of the second connecting element is slidably connected to the fourth supporting element;

wherein, upon the supporting mechanism being in a folded state, the flexible portion is in a bending state, the first supporting element and the third supporting element are disposed opposite each other and respectively supporting opposite ends of the flexible portion, the second supporting element and the fourth supporting element are disposed opposite each other and respectively supporting the first portion and the second portion, wherein there is a first included angle between the opposite ends of the flexible portion, there is a second included angle between the first portion and the second portion, and the first included angle is different from the second included angle, wherein the second shaft and the fourth shaft are fixedly connected to the fixed bracket, wherein the first connecting element comprises a first extension portion, the first extension portion is provided with a first hole for the second shaft to pass, and the second connecting element comprises a second extension portion, the second extension portion is provided with a second hole for the fourth shaft to pass, wherein the fixed bracket comprises a body bracket and a first bracket, the first bracket surrounds the second shaft and the fourth shaft, the first bracket is provided with a first recess and a second recess, the first extension portion is rotatably received in the first recess, and the second extension portion is rotatably received in the second recess.

15. A hinge, comprising:

a fixed bracket;

a supporting mechanism and a rotating mechanism, wherein the supporting mechanism comprises a first supporting element, a second supporting element, a third supporting element, and a fourth supporting element;

the rotating mechanism comprises a first connecting element and a second connecting element, wherein the first supporting element is rotatably connected to one side of the fixed bracket along a first shaft, the second supporting element is rotatably connected to one side of the first supporting element away from the fixed bracket, one end of the first connecting element is rotatably connected to the fixed bracket along a second shaft, and the other end of the first connecting element is rotatably connected to the second supporting element; the third supporting element is rotatably connected to the other side of the fixed bracket along a third shaft, the fourth supporting element is rotatably connected to one side of the third supporting element away from the fixed bracket, one end of the second connecting element is rotatably connected to the fixed bracket along a fourth shaft, and the other end of the second connecting element is slidably connected to the fourth supporting element;

wherein, upon the supporting mechanism being in a folded state, the first supporting element and the third supporting element are disposed opposite each other, and the second supporting element and the fourth supporting element are disposed opposite each other, wherein a distance between the first supporting element and the third supporting element gradually increases in a direction along the second supporting element and the fourth supporting element pointing to the fixed bracket, there is a first included angle between the first supporting element and the third supporting element, a second included angle is between the second supporting element and the fourth supporting element, and the second included angle is less than the first included angle, wherein the second shaft and the fourth shaft are fixedly connected to the fixed bracket, wherein the first connecting element comprises a first extension portion, the first extension portion is provided with a first hole for the second shaft to pass, and the second connecting element comprises a second extension portion, the second extension portion is provided with a second hole for the fourth shaft to pass, wherein the fixed bracket comprises a body bracket and a first bracket, the first bracket surrounds the second shaft and the fourth shaft, the first bracket is provided with a first recess and a second recess, the first extension portion is rotatably received in the first recess, and the second extension portion is rotatably received in the second recess.

16. The hinge as claimed in claim 15, wherein upon the supporting mechanism being in the folded state, a distance between the opposite ends of the flexible portion gradually increases in a direction along the second supporting element and the fourth supporting element pointing to the fixed bracket, and the second included angle is less than the first included angle.

* * * * *